United States Patent [19]

Kroeger et al.

[11] Patent Number: 4,626,773

[45] Date of Patent: Dec. 2, 1986

[54] METHOD AND MEANS FOR DETERMINING ROCK PROPERTIES USING TIME-DOMAIN DIELECTRIC SPECTROSCOPY

[75] Inventors: Michael K. Kroeger; John M. Longo, both of Houston, Tex.

[73] Assignee: Exxon Production Research Co., Houston, Tex.

[21] Appl. No.: 665,249

[22] Filed: Oct. 26, 1984

[51] Int. Cl.$^4$ .................. G01R 27/04; E21B 47/00
[52] U.S. Cl. .................. 324/58.5 B; 324/337; 324/376; 175/50
[58] Field of Search ............ 324/337, 58.5 R, 58.5 A, 324/58.5 B, 58.5 C, 58 R, 376; 175/40, 48, 50

[56] References Cited

U.S. PATENT DOCUMENTS

| | | | |
|---|---|---|---|
| 3,474,337 | 10/1969 | Petrick | 324/58.5 B |
| 3,582,766 | 6/1971 | Iizuka . | |
| 3,584,293 | 6/1971 | Iizuka . | |
| 3,715,667 | 2/1973 | Nicolson | 324/58.5 B |
| 3,806,795 | 4/1974 | Morey . | |
| 3,938,385 | 2/1976 | Horwath | 324/58.5 B |
| 4,013,950 | 3/1977 | Falls | 324/58.5 R |
| 4,396,062 | 8/1983 | Ikander | 324/58.5 B |
| 4,538,103 | 8/1985 | Cappon . | |

FOREIGN PATENT DOCUMENTS

| | | |
|---|---|---|
| 1496151 | 12/1977 | United Kingdom . |
| 1515850 | 6/1978 | United Kingdom . |
| 0684422 | 9/1979 | U.S.S.R. ............ 324/58.5 B |

OTHER PUBLICATIONS

M. F. Iskander, et al., "A New Electromagnetic Propagation Tool for Well Logging," SPE Paper No. 13189, presented at the 59th Annuual Technical Conference and Exhibition, Houston, Tex., Sep. 16-19, 1984.
M. F. Iskander, "Time-Domain Measurements of the Dielectric Properties of Oil Shale-The Development of an On-Line Dielectric Probe," Argonne National Lab. Instrum. and Contr. for Fossil Energy Processes Symposium, Houston, pp. 280-290, Sep., 1982.
M. F. Iskander, et al., "A Time-Domain Technique for Measurement of the Dielectric Properties of Oil Shale During Processing," Proceedings of the IEEE, vol. 69, No. 6, Jun. 1981, pp. 760-762.
R. H. Cole, et al., "Fourier Transform Dielectric Spectroscopy", published as pp. 183-206 of Fourier, Hadamard, and Hilbert Transforms in Chemistry, Edited by A. G. Marshall, (Plenum Press, New York and London 1982).
G. R. Olhoeft, "Electrical Properties and Minerals--Short Course Notes," p. 81, presented at a course at Golden, Colo. on Sep. 23-25, 1980.
F. S. C. Huang and L. C. Shen, "Analysis of Error due to Presence of Gaps in the Measurement of Rock Samples in a Coaxial Line," Geophysics, vol. 48, No. 2, (Feb., 1983), pp. 206-212.

Primary Examiner—Gerard R. Strecker
Assistant Examiner—Jose M. Solis
Attorney, Agent, or Firm—Alfred A. Equitz

[57] ABSTRACT

A method and system for measuring rock electrical properties using time-domain spectroscopy. The rock to be measured is place in direct contact with the substantially flat face of a sample cell. A voltage pulse is launched into a coaxial line connected to the sample cell. The pulse propagates through the sample cell and reflects from the rock. The incident voltage pulse and reflected voltage signal are analyzed to determine the rock's conductivity as well as the rock's dielectric constant over a broad frequency range.

34 Claims, 9 Drawing Figures

METHOD AND MEANS FOR DETERMINING ROCK PROPERTIES USING TIME-DOMAIN DIELECTRIC SPECTROSCOPY

FIELD OF THE INVENTION

This invention relates to time-domain methods and systems for measuring high frequency electrical properties of rocks and rock formations. More particularly, the invention relates to time-domain methods and systems wherein a voltage pulse is reflected from a rock and the reflected signal is analyzed in the time domain to determine high frequency electrical properties of the rock, such as the conductivity and dielectric constant.

BACKGROUND OF THE INVENTION

Many commercially significant applications exist for methods by which the electrical properties of rocks may be measured. For example, the importance of high frequency dielectric constant measurements in the field of petroleum exploration and production is evidenced by the recent emergence of frequency-domain dielectric logging tools, operating at about 20 MHz and at 1.1 GHz. Measurement of the complex dielectric constant (also referred to as "complex dielectric permittivity") and conductivity of rocks can be used to evaluate important reservoir properties such as porosity, oil/gas saturation, and mineral composition. Dielectric measurements at high frequency, particularly in the MHz through GHz range, are especially useful because they can provide reservoir information that is less affected by brine salinity than that obtainable using low frequency devices such as induction logging tools.

Throughout this specification, including the claims, the term "rock" will be used to denote the broad class of mineral masses or aggregates including those rocks associated with a rigid matrix, clays associated with a semi-rigid matrix, and porous rocks saturated by any liquid, gas, or liquid gas mixture.

Frequency domain techniques have been developed for measuring the dielectric properties of rocks. For example, a borehole logging tool, capable of measuring the travel time and attenuation of an electromagnetic wave having frequency 1.1 GHz between two receivers disposed in a borehole, is described in Wharton, et al., "Electromagnetic Propagation Logging: Advances in Technique and Interpretation," Paper SPE 9267 presented at the SPE Annual Technical Conference and Exhibition, Dallas, Tex., on Sept. 21-24, 1980. Wharton, et al. discloses determining the dielectric constant of a subterranean earth formation adjacent to the borehole by analysis of the measured travel time and attenuation. A laboratory system for determination of complex dielectric permittivity and conductivity is described in Rau, et al., "Measurement of Core Electrical Parameters at Ultrahigh and Microwave Frequencies", Journal of Petroleum Technology, November 1982, pp 2689-2700. Rau, et al. discloses the technique of reflecting from (or transmitting through) a machined rock sample an electromagnetic wave having a selected frequency in the range 100 MHz to 2 GHz. The sample holder disclosed in Rau, et al. is a rigid, coaxial, air-filled transmission line with standard coaxial connectors at each end. The measured rock sample must be machined to fit tightly in the space between the center and outer conductors of the coaxial transmission line, and the sample must be cut to a known precise length. G. S. Huchital, et al., "The Deep Propagation Tool (A New Electromagnetic Logging Tool)", Paper SPE 10988, presented at the 56th Annual Fall Tech. Conference, 1981, discloses an electromagnetic logging tool operating at a frequency in the tens of MHz range. The Huchital, et al. tool measures phase shift and attenuation of an electromagnetic wave propagating between receivers disposed in a borehole.

J. P. Poley, et al., "Use of V.H.F. Dielectric Measurements for Borehole Formation Analysis", The Log Analyst, 1978 (May–June), pp. 8–30; and R. P. Mazzagatti, et al., "Laboratory Measurement of Dielectric Constant Near 20 MHz", presented at the SPE 58th Annual Technical Conference and Exhibition, San Franciso, Calif., on Oct. 5–8, 1983, also disclose frequency-domain techniques for measuring rock dielectric properties. Poley, et al. discloses techniques for making measurements at selected frequencies in the 1.5 KHz through 500 MHz range and in the 300 MHz through 2.4 GHz range. For measurements in the 1.5 KHz through 500 MHz range, Poley, et al. discloses measuring disk shaped rock samples placed between the parallel plate electrodes of a sample holder. For measurements in the 300 MHz to 2.4 GHz range, Poley, et al. discloses measuring machined samples disposed in the annular region between the conductors of a coaxial transmission line. Mazzagatti, et al. discloses measuring cylindrical rock samples held between the parallel plates of a cell holder by determining the reflection coefficient of an electromagnetic wave (having selected frequency from the range 2–100 MHz) as the electromagnetic wave is caused to reflect from the rock sample.

Frequency-domain techniques of the types referenced above permit determination of the complex dielectric constant at only one frequency as the result of each measurement. To measure conductivity, and to extract dielectric constant information at a broad range of frequencies, conventional frequency domain techniques require time consuming multiple measurements at each of a number of different frequencies. In the case of conventional dielectric logging tools of the type referenced above, it is particularly difficult and time consuming to make measurements at several different frequencies because each such measurement requires use of a different tool. Conventional laboratory techniques of the type referenced above additionally require the difficult and time consuming step of machining solid samples to fit closely into sample cells followed by data collection at a variety of frequencies.

The method of the present invention is not a frequency domain technique. It is instead, a time-domain dielectric spectroscopic technique by which the frequency dependence of a rock's complex dielectric constant over a broad frequency range of from about 1 MHz to several GHz, as well as the rock's conductivity, may be determined in a single measurement. Throughout this specification, time-domain spectroscopy will sometimes be denoted as "TDS". TDS facilitates determination of a sample's electrical properties from real time measurements of transient currents which follow application of a voltage pulse to the sample. The theory of TDS is discussed in *Fourier, Hadamard, and Hilbert Transforms in Chemistry*, edited by A. G. Marshall, pp 183–206 (Plenum Press, New York and London 1982).

TDS techniques have been applied to determine electrical properties of liquids. See for example, U. Kaatze, et al., "Dielectric Relaxation Spectroscopy of Liquids:

Frequency Domain and Time Domain Experimental Methods", J. Phys. E: Sci. Instrum., 13, 1980, pp 133-134; and M. J. C. van Gemert, "High-Frquency Time-Domain Methods in Dielectric Spectroscopy", Phillips Res. Repts., 28, 1973, pp 530-572. Similarly, TDS techniques have been applied to measure electrical properties of powders pressed into a coaxial line sample cell. See B. C. Bunker, et al., "A Study of the Rate of Intervalence Electron Transfer Using Time Domain Reflectometry", J. Am. Chem. Soc., 103, 1981, pp 4254-4255; and B. C. Bunker, et al., "Electron-Transfer Rates in Mixed-Valence Europium Sulfide by Time Domain Reflectrometry", J. Am. Chem. Soc., 104, 1982, pp 4593-4598.

Use of a TDS technique for measuring dielectric properties of oil shale has also been disclosed in M. F. Iskander, "A Time-Domain Technique for Measurement of the Dielectric Properties of Oil Shale During Processing", Proceedings of the IEEE, 69, No. 6, June 1981, pp 760-762. The Iskander, et al. paper discloses use of a small shunt capacitor terminating a coaxial line section as a sample holder. The sample to be measured is positioned to fill a gap between the inner conductor of the coaxial line and a terminating metal plate. Thus, the size of samples that can be measured in the Iskander, et al. system is limited by the size of the gap between the inner conductor and terminating metal plate of the sample holder. It would thus be impractical to use the Iskander, et al. system for measuring the properties of rock samples (or rock formations) that are too large to be accommodated in the sample holder of such system.

SUMMARY OF THE INVENTION

The invention is a method and system for measuring rock electrical properties using time-domain spectroscopy. The rock to be characterized is placed in direct contact with the substantially flat face of a sample cell. The end of the sample cell opposite the flat face is electrically coupled to a coaxial line. The flat face of the sample cell has a central conductive region electrically coupled to the inner conductor of the coaxial line, and an outer conductive region electrically coupled to the outer conductor of the coaxial line.

A voltage pulse is launched from a pulse generator into the coaxial line so that it propagates toward the sample cell and through the sample cell to the rock. A return voltage signal reflected from the rock is detected as it propagates back toward the pulse generator. Electrical properties of the rock, such as the dielectric constant, conductivity, and dielectric relaxation time, are determined from the detected return voltage signal. The porosity, water saturation, and clay content of the rock may also be determined from the detected return voltage signal.

The method may be performed automatically using a specially designed system including a sample cell of the type described. In one embodiment, the sample cell, coaxial line, voltage pulse generator, and return voltage signal detecting means are disposed in a borehole traversing a subterranean earth formation, in order to measure electrical properties of the subterranean earth formation. In another embodiment, the system is adapted to characterize rock samples in a laboratory, via simple, non-destructive measurements that may be repeated rapidly.

DETAILED DESCRIPTION OF THE PREFERRED EMBODIMENTS

Figure 1:
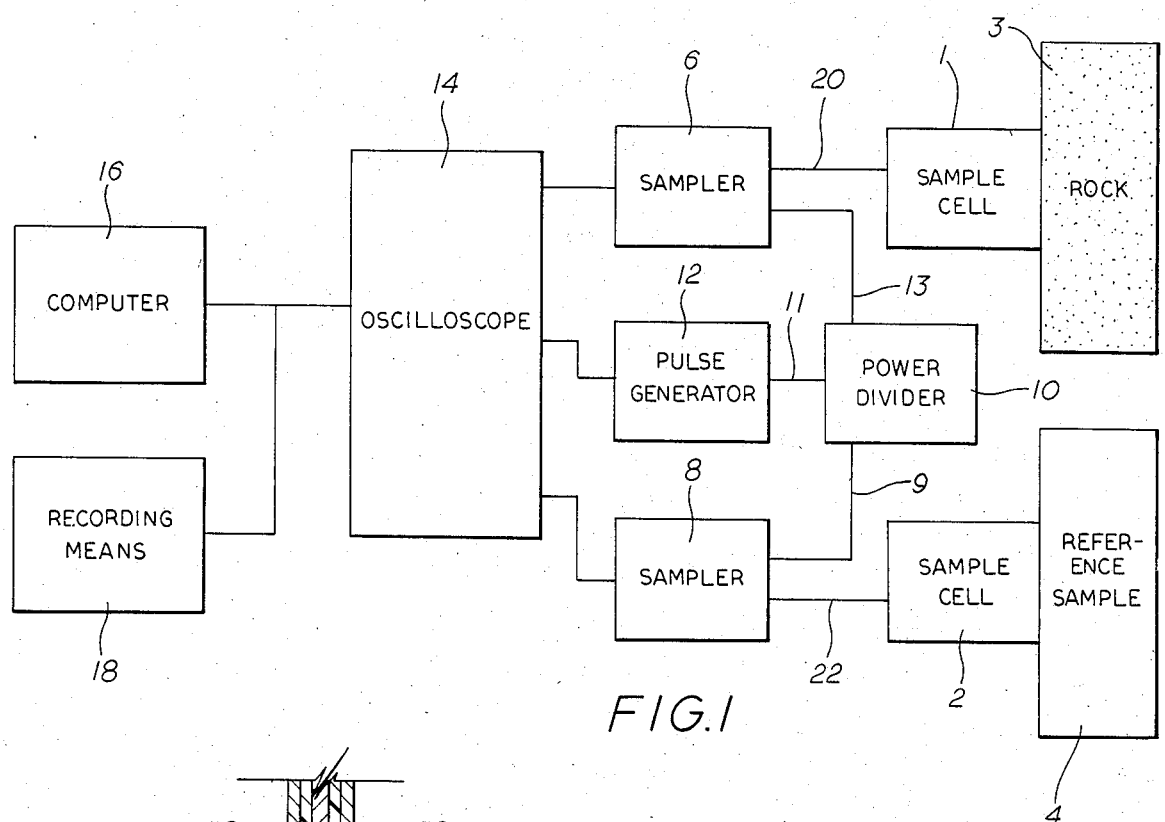
FIG. 1 is a schematic diagram of a preferred embodiment of the automated measurement system of the invention.

FIG. 1 schematically illustrates a preferred embodiment of the automated measuring system of the invention. The system of FIG. 1 is capable of single-channel or dual-channel sampling. For dual-channel sampling, sample cell 1 is positioned in electrical contact with rock 3 to be characterized, and sample cell 2 is positioned in electrical contact with reference sample 4. Reference sample 4 may be either a rock sample or a non-rock sample. Sample cells 1 and 2 are of the type to be discussed in detail below with reference to FIGS. 2 and 3. Pulse generator 12 launches a voltage pulse into coaxial line 11. The voltage pulse propagates along coaxial line 11 and is divided in power divider 10 into two substantially identical voltage pulses. One of the voltage pulses propagates through coaxial line 13, sampler (sometimes alternatively denoted herein as "detector") 6, coaxial line 20, and sample cell 1 to rock 3; the other propagates through coaxial line 9, sampler (sometimes alternatively denoted herein as "detector") 8, coaxial line 22, and sample cell 2 to reference sample 4. The voltage pulses are detected as they propagate through one of samplers 6 and 8, and the output of each sampler is supplied to oscilloscope 14. The impedances of line 20 and cell 1, and line 22 and cell 2, are matched. For single-channel sampling one of coaxial lines 9 and 13 is disconnected from power divider 10 and the other of coaxial lines 9 and 13 is directly connected (short-circuited) with coaxial line 11.

For simplicity, the following dicussion will refer only to the measurement channel including sample cell 1. It should be understood that the discussion applies equally to the measurement channel including sample cell 2. Rock 3, in general, has different propagation characteristics than does sample cell 1, and thus represents an impedance mismatch with respect to sample cell 1. The voltage pulse incident at rock 3, $V_o(t)$, is partially reflected and partially transmitted at the interface between sample cell 1 and rock 3. Many such reflections subsequently occur at both the front and back surfaces of the rock. The reflected components of the voltage pulse are propagated as voltage signal V(t) back through sample cell 1, line 20, and sampler 6 to oscilloscope 14, wherein V(t) is processed and displayed. The appearance of voltage signal V(t) will be discussed below with reference to FIGS. 4(a) and 4(b). Signal V(t), and the incident voltage pulse $V_o(t)$ are analyzed according to a time-domain spectroscopic technique to be described below with reference to FIGS. 4(a) and 4(b). Such analysis will reveal the conductivity, dielectric relaxation time, and complex dielectric constant of rock 3 over a broad frequency range, which may extend from about one MHz or less to about a few GHz or more.

The analysis may be performed using computer 16 coupled to oscilloscope 14. Recording means 18 may be connected to oscilloscope 14 and computer 16 to record the signal displayed in the oscilloscope, the output of computer 16, or both.

Suitable components for the system of FIG. 1, with the exception of suitable sample cells 1 and 2 may be selected from those commercially available. We have found that a Model 7854 oscilloscope manufactured by Tektronix, Inc. with 7S11 sampling plug-in and 7S12 TDS plug-in is suitable for use as oscilloscope 14. We have also found that Tektronix, Inc. Model S6 sampling heads are suitable for use as samplers 6 and 8 and a Tektronix, Inc. Model S52 or Model S54 pulse generator is suitable for use as pulse generator 12. A Tektronix, Inc. Model 4054 graphics computer, with 256K TRANS ERA auxiliary memory may be used as computer 16. A Tektronix, Inc. Mode. 4924 digital-tape drive may be employed as recording means 18. Alternatively, a Tektronix, Inc. TDR Cable Tester, such as Model 1502 and 1503, is suitable for use, in a single-channel embodiment, to serve the function of oscilloscope 14, sampler 6, and pulse generator 12 directly connected by a coaxial line to sampler 6.

Figure 2:
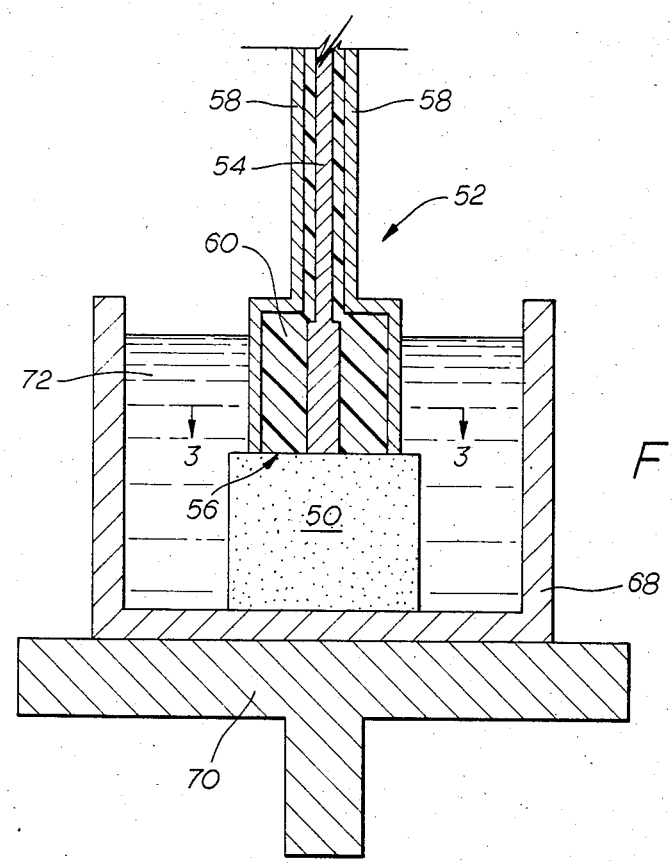
FIG. 2 is a cross-sectional view of a preferred embodiment of the sample cell of the invention, as well as a sample and a sample platform, illustrating one manner in which the sample cell may be used to measure properties of a sample.
Figure 3:
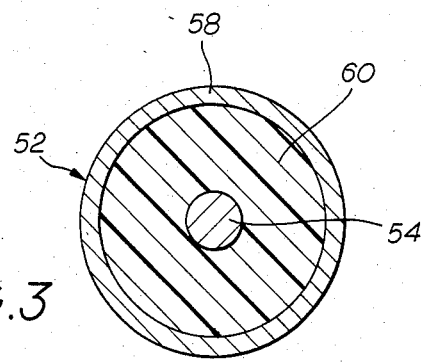
FIG. 3 is a cross-sectional view, taken along line 3—3 of FIG. 2, of the sample cell shown in FIG. 2.

The preferred embodiment of sample cells 1 and 2 (depicted in block form in FIG. 1) is shown as sample cell 52 in FIG. 2. FIG. 3 is a cross-sectional view of sample cell 52 of FIG. 2, taken along line 3—3. Sample cell 52 includes inner conductor 54, outer conductor 58, and dielectric spacing material 60. Outer conductor 58 is coaxial with inner conductor 54. Sample cell 52 has a substantially flat face 56 at one end. Inner conductor 54 and outer conductor 58 terminate at face 56, so that the terminal surfaces of conductors 54 and 58 form conductive regions of face 56. Such two conductive regions are separated by a region filled with dielectric spacing material 60. Face 56, when viewed from a position on the longitudinal axis of sample cell 52, has the same appearance as the cross-sectional view of sample cell 52 shown in FIG. 3. Sample cell 52 may readily be positioned in electrical contact with a rock by bringing face 56 of sample cell 52 into contact with the rock surface.

Although outer conductor 58 is shown in FIG. 3 as completely surrounding inner conductor 54, it should be understood that outer conductor 58 may alternatively be shaped so as to generally coaxially surround inner conductor 54, yet not totally surround inner conductor 54. For example, outer conductor 58 may coaxially surround inner conductor in only three quadrants of face 56, so that a ray drawn on face 56 outward from the center of inner conductor 54 will not intersect outer conductor 58 in one quadrant of face 56. Alternatively, outer conductor 58 may consist of two or more separated sectors of a cylindrical body, so that the outer conductive region of face 56 consists of two or more separate arcuate regions, each forming a portion of an annulus coaxially surrounding in the inner conductive region.

It should also be understood that substantially flat face 56 need not be planar as shown in FIG. 2. Rather, the face may be curved (as is the face of sample cell 154 shown in FIG. 6, which is of the same type as sample cell 52), or otherwise non-planar. The phrase "substantially flat face" will be used throughout this application, including the claims, to denote a sample cell face which is sufficiently smooth to be capable of being placed in contact with a generally smooth rock sample of interest in such a manner that both conductive regions of the face are in electrical contact with the sample.

The end of sample cell 52 opposite face 56 is coupled to the end of a coaxial line (not shown in FIG. 2) in a conventional manner (illustrated in FIG. 8, with reference to the electrical coupling between sample cell 108 and coaxial line 115) so that inner conductor 54 is electrically coupled to the inner conductor of the coaxial line and outer conductor 58 is electricaly coupled to the outer coaxial conductor of the coaxial line. Dielectric spacing material 60, the coaxial geometry of the cell, and the particular manner of connecting sample cell 52 to the coaxial line, should be chosen so that the impedance of cell 52 and the coaxial line coupled thereto are matched. We have found that teflon is suitable for use as spacing material 60.

It should be recognized that the method of the invention may be performed using an electrical line which is not a coaxial line, as a substitute for the coaxial line in the embodiment discussed above. It is essential that the electrical line employed have two distinct electrical conductors. A pair of wires would be suitable. Similarly, the sample cell of the invention need not have an inner and an outer conductive region included in its substantially flat face, as does sample cell 52 shown in FIGS. 2 and 3. Rather, the substantially flat face of the sample cell of the invention need only have two distinct conductive regions however shaped, each conductive region being electrically coupled to a different one of the two conductors in the electrical line. The two conductive regions of the sample cell should be separated from each other by a dielectric substance, which may be a solid spacing material such as teflon, or may be a gaseous dielectric material such as air.

It should also be recognized that although sample cell 52 is shown as having a large-diameter portion (the portion adjacent rock 50) and a small-diameter portion (the portion separated from rock 50 by the large-diameter portion), it is within the scope of the invention that the sample cell have any shape, provided that it is shaped so as to have a substantially flat face, which face has two conductive regions separated by dielectric material. For example, the sample cell may be cylindrical, and so have a substantially constant diameter throughout its length. Furthermore, it should be recognized that the diameter (or diameters, if the sample cell consists of two or more portions each having a different diameter, or if its diameter varies throughout its length) of the sample cell of the invention may be either greater than, smaller than, or identical with the diameter of the electrical line (which may be a coaxial line) to which it is connected. Indeed, the sample cell of the invention may consist of the end portion of the electrical line itself, provided that the end face of the electrical line is substantially flat and that the end face includes two conductive region separated by dielectric material.

It may be desirable to use the system of the invention to measure the electrical properties of rocks saturated with liquid, as well as dry rocks. FIG. 2 illustrates how sample cell 52 may be used to measure the electrical properties of rock 50 saturated with liquid 72. Liquid 72 is contained in cup 68. Rock 50 is immersed in liquid 72 and rests on the bottom of cup 68. Spring-loaded platform 70 presses rock 50 against face 56 of sample cell 52, to facilitate the desired measurements. It will be appreciated that the platform 70 and cup 68 may be used to facilitate measurement of rock 50, regardless of whether rock 50 is saturated with liquid or whether liquid 72 is contained in cup 68.

Figure 4A:
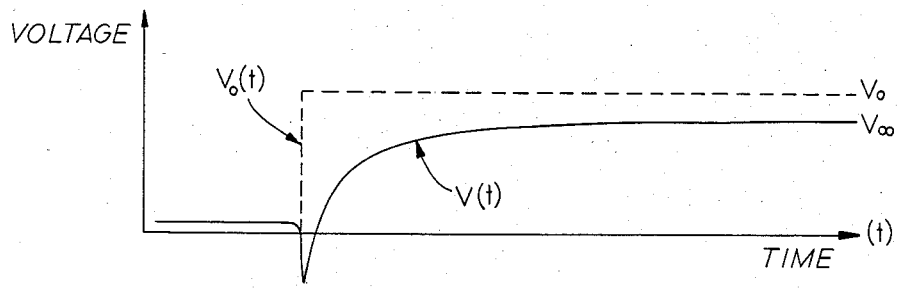
FIG. 4($a$) is a graph representing a voltage pulse, $V_o(t)$, of the type launched by the pulse generator of the invention toward a rock, and a return voltage signal, $V(t)$ resulting from reflections of voltage pulse $V_o(t)$ from the rock. p FIG. 4($b$) is a graph representing a signal, $V_o(t)-V(t)$, having amplitude equal to the difference between the amplitudes of signals $V_o(t)$ and $V(t)$.
Figure 4B:
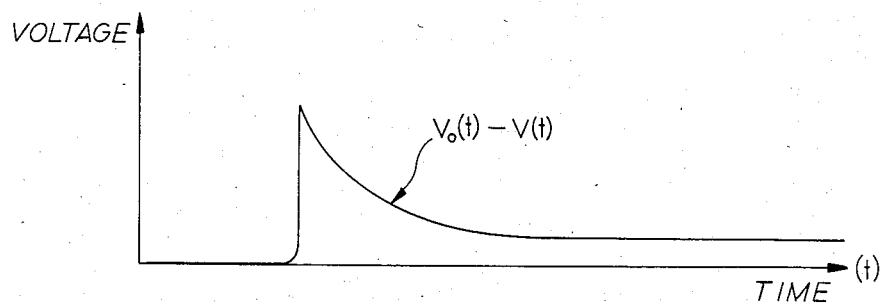

The manner in which measured data is analyzed in accordance with the invention will be discussed with reference to FIGS. 4(a) and 4(b). FIG. 4(a) shows a voltage pulse, $V_o(t)$, of the type launched by the pulse generator of the invention into a coaxial line toward a rock. We assume for purposes of discussion of FIGS. 4(a) and 4(b) that the rock is a dielectric and is characterized by conductivity $\sigma$. FIG. 4(a) also shows a return voltage signal, $V(t)$, of the type resulting from reflections of voltage pulse $V_o(t)$ in a rock positioned adjacent the flat face of the sample cell of the invention. Signals $V(t)$ and $V_o(t)$ are detected in one of samplers 6 and 8 (shown in FIG. 1) and are subsequently displayed and/or recorded. Signals $V_o(t)$ and $V(t)$ may be stretched by oscilloscope 14 (shown in FIG. 1), prior to being displayed or recorded, into signals having suitable time scale to permit analysis. If $V_o(t)$ is generated so as to have sufficiently fast rise time, Fourier analysis of $V_o(t)$ and return voltage signal $V(t)$ yields broad-band dielectric constant information, including high frequency information, equivalent to that determinable only following many separate performances of conventional frequency-domain techniques. For example, if $V_o(t)$ has rise time less than 50 picoseconds, practice of the invention will result in acquisition of dielectric constant information at frequencies up to 10 GHz. Suitable pulse generators capable of generating voltage pulses having rise time on the order of 50 picoseconds are commercially available. In general, the invention permits acquisition of dielectric constant information over a range of frequencies (sometimes referred to herein as the frequency "window" of the system of the invention) from about $(T_w)^{-1}$, where $T_w$ is the duration of pulse $V_o(t)$, up to about $(2T_r)^{-1}$, where $T_r$ is the rise time of pulse $V_o(t)$.

For purposes of this paragraph and the next, we shall assume that voltage pulse $V_o(t)$ of FIG. 4(a) will propagate through sampler 6, then through coaxial line 20, and thereafter through sample cell 1. The interface between sample cell 1 and rock 3 represents an impedance mismatch which causes a first portion of the energy in pulse $V_o(t)$ to reflect initially therefrom. This first portion of reflected energy appears as the relatively short negative "spike" in return signal $V(t)$. The fact that the amplitude of the spike in $V(t)$ is negative may be understood by noting that $V_o(t)$ would be reflected back 180° out of phase from a short circuit, and noting that the initial reflection from the rock is similar to reflection from a short circuit in coaxial line 20.

The portion of return signal $V(t)$ to the right of the negative spike in FIG. 4(a) represents a slow rise to an asymptotic voltage value $V_\infty$. This portion is due to reflections of energy in voltage pulse $V_o(t)$ within the rock subsequent to the initial transmission of such energy past the sample cell-rock interface. For a rock sample having finite, nonzero conductivity, $\sigma$, $V_\infty$ will be less than $V_o$ and greater than $-V_o$, where $V_o(t) \to V_o$ as $t \to \infty$. As $\sigma$ increases, the magnitude of $V_\infty$ will decrease toward $-V_o$. For a rock having zero conductivity, $V_\infty$ will equal $V_o$. In this latter case, the magnitude of the signal shown in FIG. 4(b) having amplitude equal to $V_o(t)-V(t)$ will approach zero as $t \to \infty$.

By analyzing signals $V(t)$ and $V_o(t)$, the rock's dielectric constant and conductivity are determined in the following manner. It should be understood that throughout this specification, including the claims, the phrase "measuring the dielectric constant of a rock sample", and variations on this phrase, is used to mean measuring the dielectric constant of the rock at each frequency of interest in the frequency window of the system employed. In order to compute the dielectric constant at each frequency in the frequency window of the system, the signals $V(t)$ and $V_o(t)$ are Fourier-transformed (or one sided Fourier or "Laplace" transformations are performed on $V(t)$ and $V_o(t)$). It is more convenient to Fourier-transform numerically the sum and difference signals $V_o(t)-V(t)$ and $V_o(t)+V(t)$ rather than to Fourier-transform directly the individual signals $V_o(t)$ and $V(t)$. The Discrete Fourier Transform of the difference signal, $V_o(t)-V(t)$, may be performed numerically to generate the quantity $$V_o(w) - V(w) = \Delta t \sum_{n=0}^{N} (\cos(wn\Delta t) - j\sin(wn\Delta t))(V_o(n\Delta t) - V(n\Delta t))$$

at each frequency $w$ in the frequency window of the system, where $N\Delta t$ is the range of time over which the signal $V_o(t)-V(t)$ extends, and $\Delta t$ is a selected small time increment. The Samulon Fourier Transform of the signal $V_o(t)+V(t)$ may be performed numerically to generate the quantity $$jw(V_o(w) + V(w)) = (\phi/\sin\phi)e^{j\phi} \sum_{n=1}^{N} (\cos(wn\Delta t) - j\sin(wn\Delta t))*$$

$(V_o(n\Delta t) + V(n\Delta t) - (V_o(n\Delta t - \Delta t) + V(n\Delta t - \Delta t)))$, where $$\phi = \frac{w\Delta t}{2} \text{ and } (\phi/\sin\phi)e^{j\phi} = \phi\cot(\phi) + j\phi.$$

The dielectric constant $\epsilon^*(w)$ is then given by the expression $\epsilon^*(w) = c/d(V_o(w) - V(w))/(jw(V_o(w) + V(w))) \times \cot h(x) = \epsilon'(w) - j\epsilon''(w),$ where $$x = \frac{j(wd(\epsilon^*(w)^{\frac{1}{2}}))}{c},$$

is the effective sample cell length representing the depth of invasion, into the rock sample, of the electric field due to voltage pulse $V_o(t)$. The effective sample cell length, d, may be measured by measuring the conductivity, $\sigma$, of a reference sample of known conductivity by performing the method of the invention on the reference sample, and then solving for d in the conductivity equation, $$\sigma = \frac{Ec}{d}(V_o - V_\infty)/(V_o + V_\infty),$$

to be discussed in greater detail below.

In a variation of the technique described above for measuring a rock's dielectric constant, a reflected pulse $V_r(t)$ from a reference sample may be measured (such as by using the measurement channel including sample cell 2, of the system shown in FIG. 1) rather than incident pulse $V_o(t)$, and used, with reflected pulse $V(t)$ (which is reflected from the rock sample of interest), to determine the dielectric constant $\epsilon^*(w)$ of a rock sample of interest. In such case, the Fourier transform, $V_r(w)$, of reflected pulse $V_R(t)$ is related to the Fourier transform, $V_o(w)$, of the incident pulse $V_o(t)$, by $V_R(w)=(1-jx)/(1+jx) V_o(w)$. The dielectric constant $\epsilon^*(w)$ of the rock sample of interest is given by the following expression in this case:

$$\epsilon^*(w) = \epsilon_R^*(w) +$$

$$((1 + X_D^2 \epsilon_R^*(w))\epsilon_1^*(w)/(1 - X_D^2 \epsilon_R^*(w)\epsilon_1^*(w)))xcoth(x)$$

$$= \epsilon_2^*(w)xcoth(x), \text{ where } X_D = \frac{wd}{c}, \epsilon_R^*(w) \text{ is the dielectric}$$

constant of the reference sample at frequency w, x is defined above, and $\epsilon_1^*(w)$ is given by $$\epsilon_1^*(w)=(c/djw)(V_R(w)-V(w))/(V_R(w)+V(w)).$$

The factor $xcoth(x)$ takes into account propagation effects and is given by $$xcoth(x) = 1 - \frac{1}{3} X_D^2 \epsilon^*(w) - \frac{1}{45} X_D^4 (\epsilon^*(w))^2$$

plus or minus higher order terms in $X_D^2$. For frequencies, w, in the practical range of interest (i.e., for w not exceeding several GHz), $xcoth(x)$ is approximately equal to $1\frac{1}{3} (wd/c)^2\epsilon^*(w)$. With this approximation, $\epsilon^*(w)$ is approximately equal to $\epsilon_3^*(w)$, where $$\epsilon_3^*(w) = \left(\epsilon_R^*(w) + \epsilon_2^*(w)\left(1 - \frac{X_D^2}{3}\epsilon_R^*(w)\right)\right) / \left(1 + \frac{X_D^2}{3}\epsilon_2^*(w)\right).$$

For frequencies less than 1 GHz, $X_D^2$ typically is negligible.

At frequencies below approximately 1–3 GHz, the expression for $\epsilon_3^*(w)$ which is given in the preceding paragraph will be a close approximation to the actual rock dielectric constant, $\epsilon^*(w)$. At frequencies higher than approximately 1–3 GHz, the described expression for $\epsilon_3^*(w)$ does not account well for multiple reflections within the coaxial lines of the measuring system. In order to generate an estimate, $\epsilon_4^*(w)$, for the rock dielectric constant, $\epsilon^*(w)$, which does adequately account for such multiple reflections, one should correct the approximate value, $\epsilon_3^*(w)$, as follows:

$$\epsilon_4^*(w)=\epsilon_R^*(w)+A(w)((\epsilon_3^*(w)-\epsilon_R^*(w))-C(w))/(1-B(w)(\epsilon_3^*(w)-\epsilon_R^*(w))),$$

where $A(w)$, $B(w)$ and $C(w)$ are calibration constants determined by performing the method of the invention on three reference samples having known dielectric constants, and then for each frequency, w, of interest, substituting each of the three known dielectric constants for $\epsilon_4^*(w)$ in the above equation and solving the resulting three simultaneous equations for the three unknown parameters $A(w)$, $B(w)$, and $C(w)$.

A rock sample's conductivity may be determined without Fourier (or Laplace) transforming the measured signals ($V_o(t)$ and $V(t)$), by identifying the conductivity, $\sigma$, as $$\sigma=\kappa(V_o-V_\infty)/(V_o+V_\infty),$$

where $\kappa$ is a calibration constant for the sample cell employed. The calibration constant $\kappa$ is equal to $Ec/d$, where c is the speed of light in a vacuum, E is the permittivity of a vacuum ($E=8.85\times10^{-10}$ farad/m), and d is the effective sample cell length. Calibration constant $\kappa$, and the effective sample cell length d, for any embodiment of the sample cell of the invention, may be measured by performing the method of the invention on a sample of known conductivity, and then solving the first equation of this paragraph for the unknown calibration constant, $\kappa$.

By analyzing data measured in accordance with the invention, additional information regarding the measured rock sample (beyond the rock's conductivity and dielectric frequency) may be extracted. For example, the relaxation time, $\tau=(2\pi f_r)^{-1}$, of the rock may be determined by identifying the relaxation frequency, $f_r$, as follows. One first obtains signals $V(t)$ and $V_o(t)$ and processes them as described above to extract the rock dielectric constant at frequencies in the frequency window of the system employed. Having so processed signals $V(t)$ and $V_o(t)$, it will be observed that at low frequencies (lower than $f_r$), as frequency increases the imaginary component of the dielectric constant of the rock will increase. At high frequencies (higher than $f_r$), the imaginary component of the dielectric constant will decrease with increasing frequency. The relaxation frequency, $f_r$, is identified as the minimum frequency above which the imaginary component of the dielectric constant decreases with increasing frequency.

By measuring the conductivity of a rock saturated with liquid of known conductivity according to the method of the invention, the porosity of the rock (which, for example, may be a core sample extracted from a subterranean earth formation) may be determined by inserting the measured conductivities into known empirical relationships (such as Archie's Law, $(\sigma_b/\sigma_r)=\phi^{-2}$, where $\sigma_b$ is the conductivity of the liquid and $\sigma_r$ is the measured conductivity of the saturated rock sample) relating such conductivity with the porosity, and then solving for porosity. The water saturation of a rock (such as a core sample extracted from a subterranean earth formation) may similarly be determined by exploiting known empirical relationships between conductivity and water saturation, and twice measuring the rock's conductivity in accordance with the method of the invention, once when the rock is saturated with formation water, and a second time, when the sample is dry.

Figure 5:
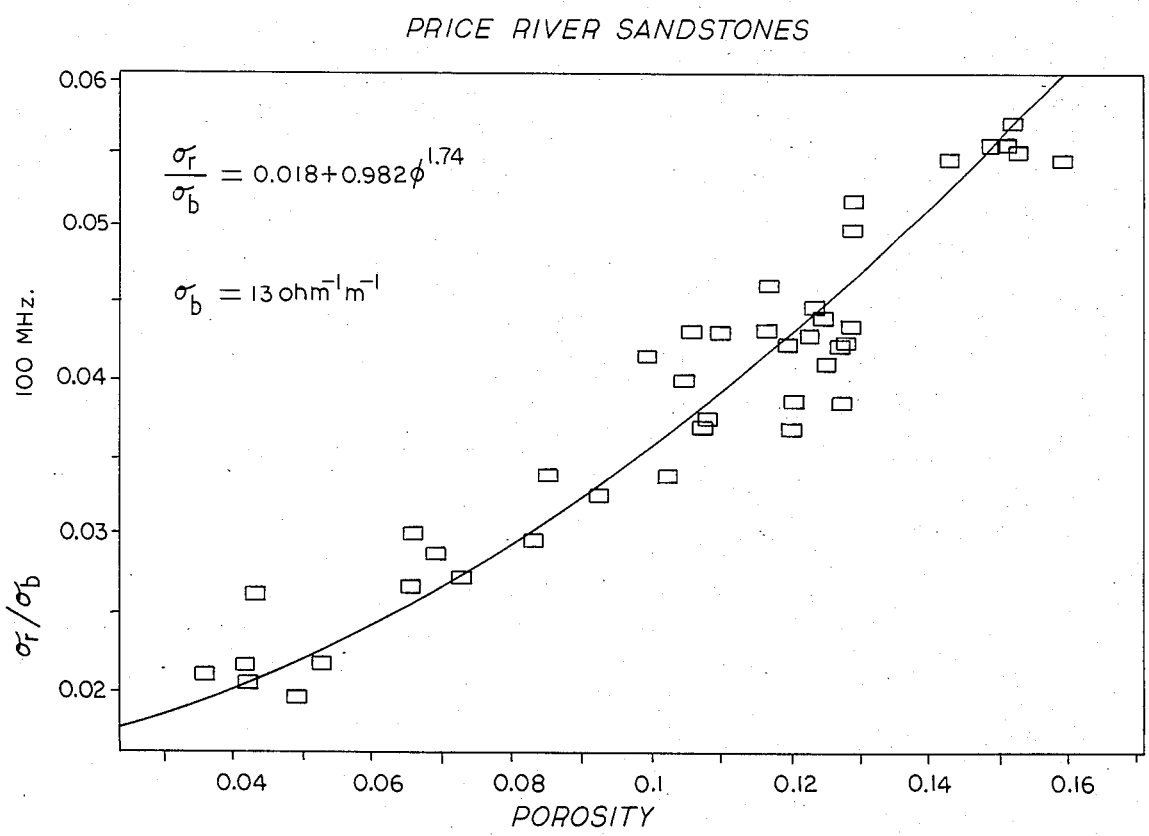
FIG. 5 is a plot of the formation factors, determined according to the method of the invention, for forty-one sandstone samples, versus the porosity of the samples determined independently.

For example, we have measured the conductivity of sandstone core samples with the system shown in FIG. 1, with a flat sample cell of the type shown in FIGS. 2 and 3. The core samples were extracted from a borehole traversing a petroleum reservoir. We first measured clean dry cores, and then repeated the measurements after saturating the cores with a liquid (brine) having known conductivity. We computed the formation factor, $F = \sigma_r/\sigma_b$, for each core, where $\sigma_r$ is the measured conductivity of the saturated core and $\sigma_b$ is the conductivity of the brine. By plotting the measured formation factor, F, versus the porosity, $\phi$, (determined independently from the TDS measurements made according to the invention) for each sample, we established that the samples were well characterized by an Archie's-type law, namely $F = \sigma_r/\sigma_b = A + B\phi^c$, where A, B, and C are constants, with the constant C equal to 1.74. The plot is shown as FIG. 5.

Figure 6:
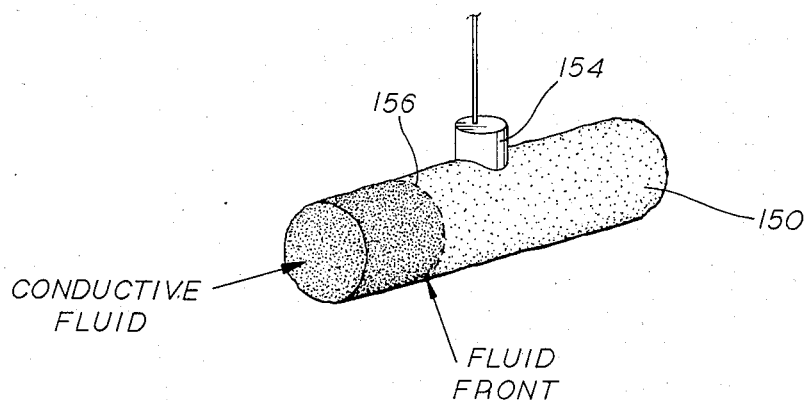
FIG. 6 is an elevational view of the sample cell of the invention and a porous core sample illustrating one manner in which the method of the invention may be used to monitor the position of a conductive fluid front as it progresses through the sample.

The method of the invention may be performed a number of times during a selected period of time to monitor any changes in the dielectric properties and conductivity of the measured rock. For example, the method may be repeated a number of times to monitor in real time electrical properties such as conductivity and dielectric constant of core samples (extracted from a subterranean earth formation) during flooding experiments. FIG. 6 is an elevational view of generally cylindrical porous core sample 150, with sample cell 154 placed adjacent to its generally cylindrical surface. Sample cell 154 is of the same type as discussed above with reference to FIGS. 2 and 3. During a flooding experiment, conductive fluid (such as brine), or nonconductive fluid, may be caused to flow through core sample 150 from left to right. Voltage pulses may repetitively be launched toward sample 150 through sample cell 154 at selected time intervals, and the conductivity and/or dielectric constant (or just the dielectric constant, in the case where non-conductive fluid is used) of sample 150 in the region adjacent sample cell 154 determined according to the present invention, in order to monitor the time-dependent position of fluid front 156.

Figure 7:
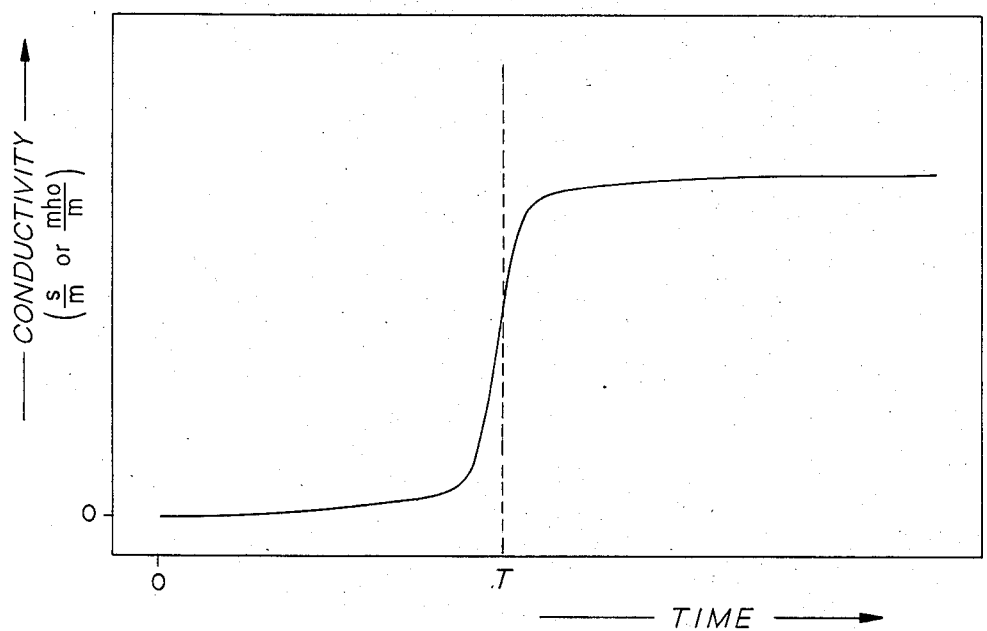
FIG. 7 is a graph representing the conductivity of a porous sample, measured in accordance with the method of the invention as a function of time, as a conductive fluid front progresses through the measured region of the sample.

FIG. 7 illustrates how the conductivity of the portion of sample 150 adjacent sample cell 154 of FIG. 6 may be measured in accordance with the invention. It will be apparent that the above-mentioned dielectric constant measurements may also be made, and the resulting data processed in the same way as described in the remainder of this paragraph with reference to measured conductivity data. FIG. 7 represents a curve drawn through a number of data points (not shown), each data point representing the measured conductivity of the portion of sample 150 adjacent sample cell 154 at a particular time in the period of interest. By recognizing that the conductivity of sample 150 when dry is substantially lower than its conductivity when saturated by the conductive fluid, the time, T, when fluid front 156 passed sample cell 154 is readily determined from FIG. 7.

By placing a plurality of sample cells, each similar to sample cell 154, at various locations along the surface of sample 150, the progress of fluid front 156 may readily be monitored. The time at which fluid front 156 passes each of the sample cells would be determined in the same manner as described above with reference to sample cell 154.

Figure 8:
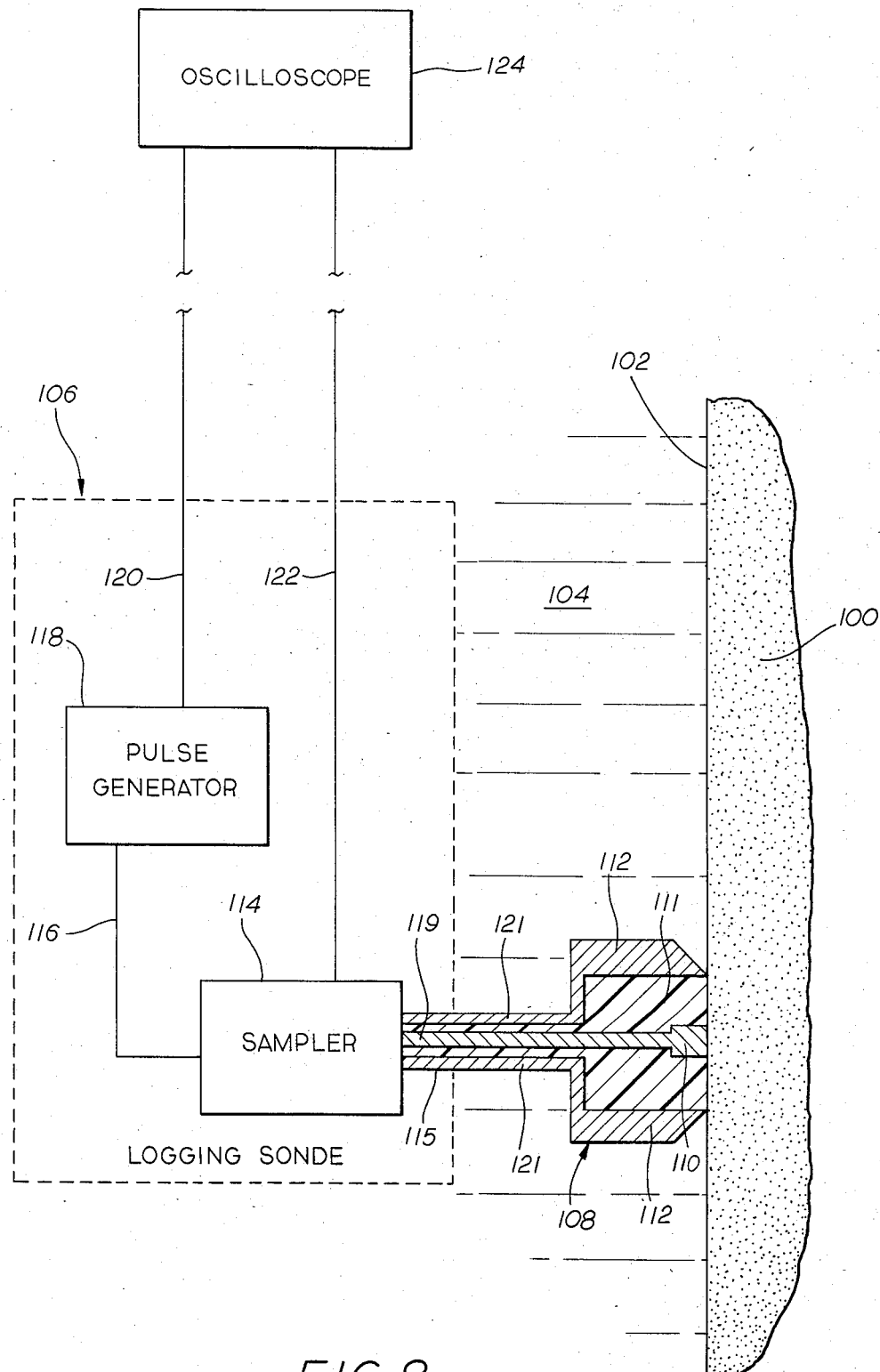
FIG. 8 is a schematic diagram of an embodiment of the system of the invention adapted for measuring electrical properties of a subterranean formation traversed by a borehole.

In one embodiment, the method of the invention is used to measure electrical properties of a subterranean rock formation traversed by a borehole. FIG. 8 shows schematically an embodiment of the system of the invention adapted for performing measurements on such a subterranean rock formation. Borehole 104 extends through subterranean rock formation 100. Logging sonde 106 houses pulse generator 118, sampler 114, coaxial line 116 and a portion of coaxial line 115. Sample cell 108 extends out from sonde 106 so that it may be positioned in direct contact with borehole wall 102, with the terminal surfaces of outer conductor 112 and inner conductor 110 in electrical contact with rock formation 100. The portion of sample cell 108 opposite borehole wall 102 is electrically coupled to coaxial line 115 so that outer conductor 112 is coupled to outer conductor 121 of coaxial line 115 and inner conductor 110 is coupled to inner conductor 119 of coaxial line 115. Dielectric spacing material 111 separates inner conductor 110 and outer conductor 112 of sample cell 108. Coaxial line 115 is connected to sampler 114 within sonde 106.

Sonde 106 is suspended in borehole 104 at a desired depth in a conventional manner and then positioned in a conventional manner to maintain stable electrical contact between sample cell 108 and borehole wall 102. Measurements may be made at the desired depth, and the sonde repositioned at another desired depth for subsequent measurements. For a conventional method of suspending and positioning logging sonde 106, see U.S. Pat. No. 3,895,289 issued July 15, 1975 to Rickey, et al.

Lines 120 and 122 are provided to connect pulse generator and sampler 14 to oscilloscope 124 located at the earth surface generally above borehole 104. Signals transmitted through line 120 instruct pulse generator 118 to launch a voltage pulse through coaxial line 116, sampler 114 (in which it is detected), coaxial line 115, and sample cell 108. The voltage signal reflected from rock formation 100 through sample cell 108 and coaxial line 115 is detected by sampler 114. The signals detected in sampler 114 are transmitted through line 122 to oscilloscope 124 for processing in the manner described above with reference to FIG. 1.

The above description is merely illustrative of the present invention. Various changes in details of methods and apparatus described may be within the scope of the appended claims without departing from the spirit of the invention.

We claim as our invention:

1. A method for detecting a voltage signal reflected from a rock, employing an electrical line having a first conductor with a first end and a second end, and a second conductor with a first end and a second end, and a sample cell having a substantially flat face including a first conductive region electrically coupled to the first end of the first conductor and a second conductive region electrically coupled to the first end of the second conductor, wherein neither the first end of the first conductor nor the first end of the second conductor extends beyond the substantially flat face, including the steps of:

(a) positioning the substantially flat face of the sample cell in contact with the rock;

(b) generating a voltage pulse which initially propagates in a first direction in the electrical line toward the rock;
(c) detecting the voltage pulse as it propagates in the first direction in the electrical line; and
(d) detecting a return voltage signal reflected from the rock into the electrical line as said return voltage signal propagates in a second direction opposite the first direction in the electrical line.

2. A method for detecting a voltage signal reflected from a rock, employing a coaxial line having an inner conductor having a first end and a second end, and an outer coaxial conductor having a first end and a second end, and a sample cell having a substantially flat face including a central conductive region electrically coupled to the first end of the inner conductor and an outer conductive region electrically coupled to the first end of the outer coaxial conductor, wherein neither the first end of the inner conductor nor the first end of the outer coaxial conductor extends beyond the substantially flat face, including the steps of:
 (a) positioning the substantially flat face of the sample cell in contact with the rock;
 (b) generating a voltage pulse which initially propagates in a first direction in the coaxial line toward the rock;
 (c) detecting the voltage pulse as it propagates in the first direction in the coaxial line; and
 (d) detecting a return voltage signal reflected from the rock into the coaxial line as said return voltage signal propagates in a second direction opposite the first direction in the coaxial line.

3. The method of claim 1 or 2 wherein the rock is a portion of a subterranean earth formation traversed by a borehole, and steps (a), (b), (c) and (d) are performed at at least one selected location in the borehole.

4. A method for detecting a voltage signal reflected from a rock and a voltage signal reflected from a reference sample, employing a first coaxial line having an inner conductor with a first end and a second end, and an outer coaxial conductor with a first end and a second end, a second coaxial line having an inner conductor with a first end and a second end and an outer coaxial conductor with a first end and a second end, a first sample cell having a substantially flat face including a central conductive region electrically coupled to the first end of the inner conductor of the first coaxial line and an outer conductive region electrically coupled to the first end of the outer coaxial conductor of the first coaxial line such that neither the first end of the inner conductor nor the first end of the outer coaxial conductor extends beyond the substantially flat face of the first sample cell, and a second sample cell having a substantially flat face including a central conductive region electrically coupled to the first end of the inner conductor of the second coaxial line and an outer conductive region electrically coupled to the first end of the outer coaxial conductor of the second coaxial line such that neither the first end of the inner conductor nor the first end of the outer coaxial conductor extends beyond the substantially flat face of the second sample cell, including the steps of:
 (a) positioning the substantially flat face of the first sample cell in contact with the rock;
 (b) generating a first voltage pulse which propagates in a first direction in the first coaxial line toward the rock;
 (c) detecting a first return voltage signal reflected from the rock into the first coaxial line as said first return voltage signal propagates in a second direction opposite the first direction in the first coaxial line;
 (d) positioning the substantially flat face of the second sample cell in contact with a reference sample;
 (e) generating a second voltage pulse which propagates in a first direction in the second coaxial line toward the reference sample; and
 (f) detecting a second return voltage signal reflected from the reference sample into the second coaxial line as said second return voltage signal propagates in a second direction opposite the first direction in the second coaxial line.

5. A method for producing a display of a voltage signal reflected from a rock, employing an electrical line having a first conductor with a first end and a second end and a second conductor with a first end and a second end, and a sample cell having a substantially flat face including a first conductive region electrically coupled to the first end of the first conductor and a second conductive region electrically coupled to the first end of the second conductor, wherein neither the first end of the first conductor nor the first end of the second conductor extends beyond the substantially flat face, including the steps of:
 (a) positioning the substantially flat face of the sample cell in contact with the rock;
 (b) generating a voltage pulse which initially propagates in a first direction in the electrical line toward the rock;
 (c) detecting the voltage pulse as it propagates in the first direction in the electrical line; and
 (d) detecting a return voltage signal reflected from the rock into the electrical line as said return voltage signal propagates in a second direction opposite the first direction in the electrical line; and
 (e) displaying the detected voltage pulse and return voltage signal.

6. A method for determining the conductivity and dielectric constant of a rock, employing an electrical line having a first conductor with a first end and a second end and a second conductor with a first end and a second end, and a sample cell having a substantially flat face including a first conductive region electrically coupled to the first end of the first conductor and a second conductive region electrically coupled to the first end of the second conductor, wherein neither the first end of the first conductor nor the first end of the second conductor extends beyond the substantially flat face, including the steps of:
 (a) positioning the substantially flat face of the sample cell in contact with the rock;
 (b) generating a voltage pulse which initially propagates in a first direction in the electrical line toward the rock;
 (c) detecting the voltage pulse as it propagates in the first direction in the electrical line;
 (d) detecting a return voltage signal reflected from the rock into the electrical line as said return voltage signal propagates in a second direction opposite the first direction in the electrical line; and
 (e) determining from the voltage pulse and return voltage signal the conductivity and dielectric constant of the rock.

7. A method for producing a display of a voltage signal reflected from a rock, employing a coaxial line having an inner conductor with a first end and a second end and an outer coaxial conductor with a first end and a second end, and a sample cell having a substantially flat face including a central conductive region electrically coupled to the first end of the inner conductor and an outer conductive region electrically coupled to the first end of the outer coaxial conductor, wherein neither the first end of the inner conductor nor the first end of the outer conductor extends beyond the substantially flat face, including the steps of:

(a) positioning the substantially flat face of the sample cell in contact with the rock;

(b) generating a voltage pulse which initially propagates in a first direction in the coaxial line toward the rock;

(c) detecting the voltage pulse as it propagates in the first direction in the coaxial line;

(d) detecting a return voltage signal reflected from the rock into the coaxial line as said return voltage signal propagates in a second direction opposite the first direction in the coaxial line; and (e) displaying the detected voltage pulse and return voltage signal.

8. A method for determining the conductivity and dielectric constant of a rock, employing a coaxial line having an inner conductor with a first end and a second end and an outer coaxial conductor with a first end and a second end, and a sample cell having a substantially flat face including a central conductive region electrically coupled to the first end of the inner conductor and an outer conductive region electrically coupled to the first end of the outer coaxial conductor, wherein neither the first end of the inner conductor nor the first end of the outer coaxial conductor extends beyond the substantially flat face, including the steps of:

(a) positioning the substantially flat face of the sample cell in contact with the rock;

(b) generating a voltage pulse which initially propagates in a first direction in the coaxial line toward the rock;

(c) detecting the voltage pulse as it propagates in the first direction to the coaxial line;

(d) detecting a return voltage signal reflected from the rock into the coaxial line as said return voltage signal propagates in a second direction opposite the first direction in the coaxial line; and (e) determining from the voltage pulse and return voltage signal the conductivity and dielectric constant of the rock.

9. The method of claim 5, 6, 7, or 8, wherein the voltage pulse has a rise time less than about 50 picoseconds.

10. The method of claim 6 or 8, wherein the rock is saturated with liquid of known conductivity, and further including the step of:

(f) determining the rock porosity from the known liquid conductivity and the rock conductivity determined in step (e).

11. The method of claim 6 or 8, also including the step of:

(f) determining from the voltage pulse and the return voltage signal the dielectric relaxation time of the rock.

12. The method of claims 5, 6, 7, or 8 wherein the rock is a portion of a subterranean earth formation traversed by a borehole and steps (a), (b), (c) and (d) are performed in the borehole.

13. A method for detecting a voltage signal reflected from a rock, employing an electrical line having a first conductor with a first end and a second end, a second conductor with a first end and a second end, and a substantially flat end surface including a first conductive region electrically coupled to the first end of the first conductor and a second conductive region, separated from the first conductive region by dielectric material and electrically coupled to the first end of the second conductor, wherein neither the first end of the first conductor nor the first end of the second conductor extends beyond the substantially flat end surface, including the steps of:

(a) positioning the substantially flat end surface of the electrical line in contact with the rock;

(b) generating a voltage pulse which initially propagates in a first direction in the electrical line toward the rock;

(c) detecting the voltage pulse as it propagates in the first direction in the electrical line; and (d) detecting a return voltage signal reflected from the rock into the electrical line as said return voltage signal propagates in a second direction opposite the first direction in the electrical line.

14. A method for detecting a voltage signal reflected from a rock, employing a coaxial line having an inner conductor with a first end and a second end, an outer coaxial conductor with a first end and a second end, and a substantially flat end surface including a central conductive region electrically coupled to the first end of the inner conductor and an outer conductive region, separated from the inner conductive region by dielectric material and electrically coupled to the first end of the outer coaxial conductor, wherein neither the first end of the inner conductor nor the first end of the outer coaxial conductor extends beyond the substantially flat end surface, including the steps of:

(a) positioning the substantially flat end surface of the coaxial line in contact with the rock;

(b) generating a voltage pulse which initially propagates in a first direction in the coaxial line toward the rock;

(c) detecting the voltage pulse as it propagates in the first direction in the coaxial line; and (d) detecting a return voltage signal reflected from the rock into the coaxial line as said return voltage signal propagates in a second direction opposite the first direction in the coaxial line.

15. The method of claim 13 or 14 wherein the rock is a portion of a subterranean earth formation traversed by a borehole, and steps (a), (b), (c) and (d) are performed at at least one selected location in the borehole.

16. A method for detecting a voltage signal reflected from a rock and a voltage signal reflected from a reference sample, employing a first coaxial line having an inner conductor with a first end and a second end, and an outer coaxial conductor with a first end and a second end, a second coaxial line having an inner conductor with a first end and a second end and an outer coaxial conductor with a first end and a second end, said first coaxial line having a substantially flat end surface including a central conductive region electrically coupled to the first end of the inner conductor of the first coaxial line and outer conductive region, separated from the inner conductive region by dielectric material and electrically coupled to the first end of the outer coaxial conductor of the first coaxial line, and said second coaxial line having a substantially flat end surface including a central conductive region electrically coupled to the first end of the inner conductor of the second coaxial line and an outer conductive region, separated from the inner conductive region by dielectric material and electrically coupled to the first end of the outer coaxial conductor of the second coaxial line, wherein neither the first end of the inner conductor of the first coaxial line nor the first end of the outer coaxial conductor of the first coaxial line extends beyond the substantially flat end surface of the first coaxial line, and neither the first end of the inner conductor of the second coaxial line nor the first end of the outer coaxial conductor of the second coaxial line extends beyond the substantially flat end surface of the second coaxial line, including the steps of:

(a) positioning the substantially flat end surface of the first coaxial line cell in contact with the rock;

(b) generating a first voltage pulse which propagates in a first direction in the first coaxial line toward the rock;

(c) detecting a first return voltage signal reflected from the rock into the first coaxial line as said first return voltage signal propagates in a second direction opposite the first direction in the first coaxial line;

(d) positioning the substantially flat end surface of the second coaxial line in contact with a reference sample;

(e) generating a second voltage pulse which propagates in a first direction in the second coaxial line toward the reference sample; and (f) detecting a second return voltage signal reflected from the reference sample into the second coaxial line as said second return voltage signal propagates in a second direction opposite the first direction in the second coaxial line.

17. A method for producing a display of a voltage signal reflected from a rock, employing an electrical line having a first conductor with a first end and a second end and a second conductor with a first end and a second end, said electrical line having a substantially flat end surface including a first conductive region electrically coupled to the first end of the first conductor and a second conductive region, separated from the first conductive region by dielectric material and electrically coupled to the first end of the second conductor, wherein neither the first end of the first conductor nor the first end of the second conductor extends beyond the substantially flat end surface, including the steps of:

(a) positioning the substantially flat end surface of the electrical line in contact with the rock;

(b) generating a voltage pulse which initially propagates in a first direction in the electrical line toward the rock;

(c) detecting the voltage pulse as it propagates in the first direction in the electrical line; and (d) detecting a return voltage signal reflected from the rock into the electrical line as said return voltage signal propagates in a second direction opposite the first direction in the electrical line; and (e) displaying the detected voltage pulse and the detected return voltage signal.

18. A method for determining the conductivity and dielectric constant of a rock, employing an electrical line having a first conductor with a first end and a second end, a second conductor with a first end and a second end, and a substantially flat end surface including a first conductive region electrically coupled to the first end of the first conductor and a second conductive region, separated from the first conductive region by dielectric material and electrically coupled to the first end of the second conductor, wherein neither the first end of the first conductor nor the first end of the second conductor extends beyond the substantially flat end surface, including the steps of:

(a) positioning the substantially flat end surface of the sample cell in contact with the rock;

(b) generating a voltage pulse which initially propagates in a first direction in the electrical line toward the rock;

(c) detecting the voltage pulse as it propagates in the first direction in the electrical line;

(d) detecting a return voltage signal reflected from the rock into the electrical line as said return voltage signal propagates in a second direction opposite the first direction in the electrical line; and (e) determining from the voltage pulse and return voltage signal the conductivity and dielectric constant of the rock.

19. A method for determining rock conductivity and dielectric constant, employing at least one coaxial line having an inner conductor with a first end and a second end, and an outer coaxial conductor with a first end and a second end, and one sample cell for each coaxial line, each said sample cell having a substantially flat face including a central conductive region electrically coupled to the first end of the inner conductor of one of the coaxial lines and an outer conductive region electrically coupled to the first end of the outer coaxial conductor of that coaxial line, wherein neither the first end of the inner conductor nor the first end of the outer coaxial conductor extends beyond the substantially flat face, including the steps of:

(a) positioning the substantially flat face of each sample cell in contact with the rock;

(b) generating in each coaxial line a plurality of voltage pulses, in such a manner that all of the voltage pulses are generated during a selected time period, and the voltage pulses in each coaxial line initially propagate toward the rock;

(c) detecting each of the plurality of voltage pulses in each coaxial line as the voltage pulse propagates toward the rock in the coaxial line;

(d) detecting in each coaxial line a plurality of return voltage signals reflected from the rock into the coaxial line as said voltage signals propagate in the coaxial line away from the rock, each return voltage signal resulting from reflections of a different one of the plurality of voltage pulses generated in the coaxial line;

(e) determining from each voltage pulse and the return voltage signal associated with that voltage pulse the conductivity and dielectric constant of a region of the rock at a time occurring in the time period during which the reflections resulting in said return voltage signal occurred.

20. The method of claim 19 wherein one coaxial line and one associated sample cell are employed.

21. The method of claim 19 wherein the rock is a portion of a subterranean earth formation traversed by a borehole, and steps (a), (b), (c) and (d) are performed at at least one selected location in the borehole.

22. A method for determining the dielectric constant of a rock, employing a first coaxial line having an inner conductor with a first end and a second end, and an outer coaxial conductor with a first end and a second end, a second coaxial line having an inner conductor with a first end and a second end an outer coaxial conductor with a first end and a second end, a first sample cell having a substantially flat face including a central conductive region electrically coupled to the first end of the inner conductor of the first coaxial line and an outer conductive region electrically coupled to the first end of the outer coaxial conductor of the first coaxial line such that neither the first end of the inner conductor nor the first end of the outer coaxial conductor extends beyond the substantially flat face of the first sample cell, and a second sample cell having a substantially flat face including a central conductive region electrically coupled to the first end of the inner conductor of the second coaxial line and an outer conductive region electrically coupled to the first end of the outer coaxial conductor of the second coaxial line such that neither the first end of the inner conductor nor the first end of the outer coaxial conductor extends beyond the substantially flat face of the second sample cell, including the steps of:

(a) positioning the substantially flat face of the first sample cell in contact with the rock;

(b) generating a first voltage pulse which propagates in a first direction in the first coaxial line toward the rock;

(c) detecting a first return voltage signal reflected from the rock into the first coaxial line as said first return voltage signal propagates in a second direction opposite the first direction in the first coaxial line;

(d) positioning the substantially flat face of the second sample cell in contact with a reference sample;

(e) generating a second voltage pulse which propagates in a first direction in the second coaxial line toward the reference sample; and (f) detecting a second return voltage signal reflected from the reference sample into the second coaxial line as said second return voltage signal propagates in a second direction opposite the first direction in the second coaxial line; and (g) determining from the first return voltage signal and the second return voltage signal the dielectric constant of the rock.

23. A method for determining the dielectric constant of a rock, employing a coaxial line having an inner conductor with a first end and a second end and an outer coaxial conductor with a first end and a second end, a sample cell having a substantially flat face including a central conductive region electrically coupled to the first end of the inner conductor and an outer conductive region electrically coupled to the first end of the outer coaxial conductor, wherein neither the first end of the inner conductor nor the first end of the outer coaxial conductor extends beyond the substantially flat face, including the steps of:

(a) positioning the substantially flat face of the sample cell in contact with the rock;

(b) generating a first voltage pulse which propagates in a first direction in the coaxial line toward the sample cell;

(c) detecting a first return voltage signal reflected from the rock into the coaxial line as said first return voltage signal propagates in a second direction opposite the first direction in the coaxial line;

(d) positioning the substantially flat face of the sample cell in contact with a reference sample;

(e) generating a second voltage pulse which propagates in the first direction in the coaxial line toward the sample cell;

(f) detecting a second return voltage signal reflected from the reference sample into the coaxial line as said second return voltage signal propagates in the second direction opposite the first direction in the coaxial line; and (g) determining from the first return voltage signal and the second return voltage signal the dielectric constant of the rock.

24. A method for producing a display of a voltage signal reflected from a rock and a voltage signal reflected from a reference sample, employing a first coaxial line having an inner conductor with a first end and a second end, and an outer coaxial conductor with a first end and a second end, a second coaxial line having an inner conductor with a first end and a second end and an outer coaxial conductor with a first end and a second end, said first coaxial line having a substantially flat end surface including a central conductive region electrically coupled to the first end of the inner conductor of the first coaxial line and an outer conductive region, separated from the inner conductive region by dielectric material and electrically coupled to the first end of the outer coaxial conductor of the first coaxial line, and said second coaxial line having a substantially flat end surface including a central conductive region electrically coupled to the first end of the inner conductor of the second coaxial line and an outer conductive region, separated from the inner conductive region by dielectric material and electrically coupled to the first end of the outer coaxial conductor of the second coaxial line, wherein neither the first end of the inner conductor of the first coaxial line nor the first end of the outer coaxial conductor of the first coaxial line extends beyond the substantially flat end surface of the first coaxial line, and neither the first end of the inner conductor of the second coaxial line nor the first end of the outer coaxial conductor of the second coaxial line extends beyond the substantially flat end surface of the second coaxial line, including the steps of:

(a) positioning the substantially flat end surface of the first coaxial line cell in contact with the rock;

(b) generating a first voltage pulse which propagates in a first direction in the first coaxial line toward the rock;

(c) detecting a first return voltage signal reflected from the rock into the first coaxial line as said first return voltage signal propagates in a second direction opposite the first direction in the first coaxial line;

(d) positioning the substantially flat end surface of the second coaxial line in contact with a reference sample;

(e) generating a second voltage pulse which propagates in a first direction in the second coaxial line toward the reference sample; and (f) detecting a second return voltage signal reflected from the reference sample into the second coaxial line as said second return voltage signal propagates in a second direction opposite the first direction in the second coaxial line; and (g) displaying the detected first return voltage signal and the detected second return voltage signal.

25. A system for producing a display of voltage signals, including:

(a) an elongated coaxial line having an inner conductor with a first end and a second end and an outer coaxial conductor with a first end and a second end;

(b) a sample cell having a substantially flat face including a central conductive region electrically coupled to the first end of the inner conductor, an outer conductive region electrically coupled to the first end of the outer coaxial conductor, and dielectric spacing material separating the central conductive region from the outer conductive region, wherein neither the first end of the inner conductor nor the first end of the outer coaxial conductor extends beyond the substantially flat face;

(c) a pulse generator electrically coupled to the second end of the inner conductor and the second end of the outer coaxial conductor, and capable of launching a voltage pulse into the coaxial line;

(d) a detector electrically coupled to the coaxial line at a first location for detecting voltage signals propagating in the coaxial line through the first location; and (e) an oscilloscope coupled to the detector and capable of transforming the voltage signals detected in the detector into modified signals having a selected time scale and displaying the modified signals.

26. A system for producing a display of voltage signals, including:

(a) an elongated electrical line, having a first conductor with a first end and a second end and a second conductor with a first end and a second end, said line terminating in a substantially flat face including a first conductive region electrically coupled to the first end of the first conductor and a second conductive region separated from the first conductive region by a region of dielectric material, said second conductive region being electrically coupled to the first end of the second conductor, wherein neither the first end of the first conductor nor the first end of the second conductor extends beyond the substantially flat face;

(b) a pulse generator electrically coupled to the second end of the first conductor and the second end of the second conductor and capable of launching a voltage pulse into the electrical line;

(c) a detector electrically coupled to the electrical line at a first location for detecting voltage signals propagating in the electrical line through the first location; and (d) an oscilloscope coupled to the detector and capable of transforming the voltage signals detected in the detector into modified signals having a selected time scale and displaying the modified signals.

27. A system for producing a display of voltage signals, including:

(a) an elongated electrical line, having a first conductor with a first end and a second end and a second conductor with a first end and a second end;

(b) a sample cell having a substantially flat face including a first conductive region electrically coupled to the first end of the first conductor and a second conductive region separated from the first conductive region by a region of dielectric material, said second conductive region being electrically coupled to the first end of the second conductor, wherein neither the first end of the first conductor nor the first end of the second conductor extends beyond the substantially flat face;

(c) a pulse generator electrically coupled to the second end of the first conductor and the second end of the second conductor, and capable of launching a voltage pulse into the electrical line;

(d) a detector electrically coupled to the electrical line at a first location for detecting voltage signals propagating in the electrical line through the first location; and (e) an oscilloscope coupled to the detector and capable of transforming the voltage signals detected in the detector into modified signals having a selected time scale and displaying the modified signals.

28. The system of claim 26 or 27, also including means for recording the modified signals.

29. The system of claim 26 or 27, wherein the pulse generator is capable of launching into the electrical line a voltage pulse having rise time less than about 50 picoseconds.

30. The system of claim 26 wherein the electrical line, pulse generator, and detector are adapted to be disposed in a borehole.

31. The system of claim 27 wherein the electrical line, sample cell, pulse generator, and detector are adapted to be disposed in a borehole.

32. The system of claim 26 or 27, wherein the electrical line is a coaxial line, and the second conductor is disposed around and in coaxial relationship with the first conductor, and the first and second conductive regions are in a coaxial relationship, with the second conductive region surrounding the first conductive region.

33. The system of claim 25 wherein the pulse generator is capable of launching into the coaxial line a voltage pulse having rise time less than about 50 picoseconds.

34. The system of claim 25, wherein the coaxial line, sample cell, pulse generator, and detector are adapted to be disposed in a borehole traversing the rock to be characterized.

* * * * *